United States Patent [19]
Conrod et al.

[11] Patent Number: 5,998,237
[45] Date of Patent: Dec. 7, 1999

[54] METHOD FOR ADDING LAYERS TO A PWB WHICH YIELDS HIGH LEVELS OF COPPER TO DIELECTRIC ADHESION

[75] Inventors: Jay B. Conrod, Cheshire; Van K. Chiem, Stamford; Paul Menkin, Branford, all of Conn.

[73] Assignee: Enthone-OMI, Inc., West Haven, Conn.

[21] Appl. No.: 08/718,634

[22] Filed: Sep. 17, 1996

[51] Int. Cl.⁶ .................................................. H01L 21/44
[52] U.S. Cl. ........................................... 438/106; 438/783
[58] Field of Search .................................. 438/106, 780, 438/781, 783, 784

[56] References Cited

U.S. PATENT DOCUMENTS

| | | |
|---|---|---|
| 3,011,920 | 12/1961 | Shipley, Jr. . |
| 3,252,351 | 5/1966 | Martin . |
| 3,758,732 | 9/1973 | Hagedorn-Olsen . |
| 3,865,623 | 2/1975 | Allen, Jr. et al. . |
| 4,042,729 | 8/1977 | Polichette et al. . |
| 4,054,693 | 10/1977 | Leech et al. . |
| 4,086,128 | 4/1978 | Sugio et al. . |
| 4,362,766 | 12/1982 | Dannhäuser et al. . |
| 4,425,380 | 1/1984 | Nuzzi et al. . |
| 4,476,483 | 10/1984 | van de Ven et al. . |
| 4,592,852 | 6/1986 | Courduvelis et al. . |
| 4,629,636 | 12/1986 | Courduvelis et al. . |
| 4,795,693 | 1/1989 | Ors et al. . |
| 4,902,610 | 2/1990 | Shipley . |
| 4,927,983 | 5/1990 | Jones et al. . |
| 5,097,593 | 3/1992 | Jones et al. . |
| 5,100,970 | 3/1992 | Roberts et al. . |
| 5,149,590 | 9/1992 | Arthur et al. . |
| 5,200,026 | 4/1993 | Okabe . |
| 5,246,817 | 9/1993 | Shipley, Jr. . |
| 5,266,446 | 11/1993 | Chang et al. . |
| 5,334,488 | 8/1994 | Shipley, Jr. . |
| 5,358,602 | 10/1994 | Sutcliffe et al. . |
| 5,368,718 | 11/1994 | Conrod et al. . |
| 5,368,921 | 11/1994 | Ishii et al. . |
| 5,374,453 | 12/1994 | Swei et al. . |
| 5,376,248 | 12/1994 | Conrod et al. . |

OTHER PUBLICATIONS

"Surface Laminar Circuit Packaging", Y. Tsukada et al., pp. 22–27, IEEE, 1992.

"Surface Laminar Circuit, A Low Cost High Density Printed Circuit Board", Y. Tsukada et al., pp. 537–542, Surface Mount Int., 1992.

*Primary Examiner*—Kevin M. Picardat
*Attorney, Agent, or Firm*—DeLio & Peterson LLC; Richard P. Mueller

[57] ABSTRACT

A permanent curable photosensitive liquid dielectric polymer composition is disclosed for making copper printed circuit boards having at least one photosensitive dielectric polymer layer containing vias and circuitry thereon wherein the polymer layer has enhanced copper to dielectric adhesion. The dielectric composition preferably comprises an acrylated epoxy and a metal adhesion effective amount of amorphous silica. Printed circuit boards made using the photodefinable dielectric polymer and a method for making the printed circuit boards are also disclosed. A twice performed permanganate etching process for texturing the dielectric surface is also preferably used to further enhance the copper to dielectric adhesion.

14 Claims, No Drawings

METHOD FOR ADDING LAYERS TO A PWB WHICH YIELDS HIGH LEVELS OF COPPER TO DIELECTRIC ADHESION

BACKGROUND OF THE INVENTION

1. Field of the Invention

This invention relates to a method for the manufacture of printed circuit (wiring) boards and, in particular, to printed circuits boards made using a photosensitive dielectric material having enhanced copper to dielectric adhesion, wherein the dielectric material is used to form layers on the printed circuit board as a base for electrical circuitry and for photoforming vias.

2. Description of Related Art

Printed circuit boards are an integral part of electronic equipment and there have been continuing efforts to increase the interconnection density and electrical efficiency of printed circuit boards and thus decrease their size and cost. The technology relating to printed circuit boards goes back a number of years and, in general, a printed circuit is patterned on the surface of a dielectric material such as a plastic substrate using many techniques including electroless and electrolytic plating. These boards vary in design and may have a copper layer on each surface of the plastic substrate usually epoxy (termed 2-sided boards) or they can be multi-layer boards which have a plurality of interleaved parallel planar copper and epoxy layers. In both types, through-holes are drilled in the board and metal plated to facility connection between the copper layer circuits.

The trend in recent years to decrease the size of electrical equipment has resulted in the need for electronic packaging which satisfy a variety of requirements including a high density of electrical circuitry, high performance, and reliability and low cost. To achieve these goals, the printed circuit board was redesigned to reduce the through hole size since this was found to be a limiting factor in the manufacture of printed circuit boards. The presently used printed circuit boards still use a plastic substrate such as a FR4 glass epoxy material which contains surface circuitry but, instead of utilizing multiple layers of such an epoxy substrate to build a multi-layer printed circuit board, additional layers are built-up using thin dielectric layers made of a permanent photosensitive material on which the circuitry is plated. Signal interconnection between wiring planes is done by a photo via hole process in the dielectric layers by which via holes can be made much smaller and more economically than by conventional mechanical (e.g., drilling) or other methods. High density wiring is thus achieved by the use of small photo via holes, fine circuit lines made by thin copper conductors and a thin dielectric layer. The photosensitive material is also known as a photo definable dielectric and the terms may be interchanged.

To produce such high density printed circuit boards, a single-sided board, two-sided board or a multi-layer board may be used as the starting substrate. A photosensitive dielectric material such as an epoxy is applied to the substrate by any of a number of processes such as a curtain coating process in which the liquid dielectric flows like a curtain from a narrow slit with the substrate board running under the slit and which board receives a coating of the dielectric material. Typically, signal via holes are then formed by photoetching of the epoxy after an initial cure. The etched epoxy layer is then finally cured to produce a dielectric material having the necessary characteristics of hardness, low dielectric constant, high glass transition temperature, low moisture absorption and low cure temperature, among others. A circuit conductive layer is then plated on the dielectric layer by any of the known techniques such as the subtractive, additive, and semi additive methods as is well known in the art.

For purposes of illustration, plating of the dielectric layer will be described for the subtractive process (termed panel plating) on a circuit patterned on a two-sided printed circuit board containing through-holes although the invention is applicable to other methods of manufacture. The photosensitive dielectric is applied to the board and allowed to tack dry. The board is exposed to radiation to form the desired via holes and developed to expose the holes. The board is then cured to harden the dielectric. Before electroless plating, the surface of the dielectric is preferably etched using an etchant such as an alkaline permanganate solution to increase the adhesion of copper plating to the dielectric surface. A copper layer is then bonded to the textured dielectric surface using a high press lamination process or preferably a wet process comprising an electroless copper flash followed by electroplating with copper to the desired thickness. A photoresist is then coated onto the copper layer and is exposed and developed so that the areas of the copper that are to ultimately form the desired copper pattern remain covered. The portions of the copper layer that are not covered by the delineated photoresist are removed by etching leaving the desired copper pattern. After etching, the photoresist is stripped leaving the desired circuit pattern on surface of the dielectric material. Additional layers are formed by repeating the above steps of applying the dielectric material, forming via holes, developing, curing, texturing, copper plating, applying a photoresist, imaging, developing, etching and stripping to form a multilayer board. When the last layer is formed, it is generally desirable to apply a solder mask to protect the circuitry on the surface of the board. In another fabrication process termed a pattern plating process, the above steps are followed up to the electroless copper flash step. After the copper flash step, a resist is applied, exposed and developed. The board is then electroplated, the remaining resist stripped and the copper flash coating etched. The above steps are then repeated to form a multilayer board and a solder mask applied to the upper layer.

Other fabrication processes include direct metallization processes wherein a plastic substrate may be electrolytically plated without the need for any prior electroless plating as described in U.S. Pat. Nos. 5,358,602 and 5,376,248 both of which patents are hereby incorporated by reference.

A number of patents have issued directed to making high-density printed wiring boards (PWB's) using such a thin photosensitive dielectric material and fabrication process. Exemplary are U.S. Pat. Nos. 4,795,693; 4,902,610; 4,927,983; 5,097,593; 5,246,817; 5,266,446 and 5,344,488. An article entitled "Surface Laminar Circuit Packaging" by Tsukada et al. published in 1992 IEEE, pages 22–27 also shows this method. The above patents and article are hereby incorporated by reference.

An important consideration in the above processes regardless of the fabrication process used is the adhesion of the copper plating to the dielectric surface. Without proper adhesion, the reliability of the circuitry will be compromised and defective printed circuit boards will result. The problems in plating plastic dielectric substrates such as epoxy or other such materials are well known in the art and a number of methods have been developed over the years to improve the adhesion of the metal plating to the substrate. These methods generally employ oxidants to etch the surface of the plastic prior to plating and include chromic acid, sulfuric acid and alkaline permanganate solutions. The toxicity of the chromium compounds and their potential hazards as water pollutants and the safety precautions needed with sulfuric acid have increased the commercial use of permanganate solutions, particularly alkaline permanganate solutions and a number of patents have been granted in this area. For example, U.S. Pat. No. 3,252,351 shows the etching of acrylonitrile-butadiene-styrene interpolymer (ABS plastics). U.S. Pat. Nos. 4,042,729 and 4,054,693 disclose stable, highly active etching solutions containing particular ratios of manganate ions and permanganate ions by controlling the pH in the range of 11–13. U.S. Pat. No. 4,425,380 is specifically directed to cleaning through-holes of residual manganese prior to plating. U.S. Pat. Nos. 4,592,852 and 4,629,636 assigned to the assignee of the present invention disclose improved alkaline permanganate compositions for etching printed circuit boards by incorporating a secondary oxidant in the solution capable of oxidizing formed manganate ions to permanganate ions. The disclosures of the above patents are hereby incorporated by reference.

Bearing in mind the problems and deficiencies of the prior art, it is therefore an object of the present invention to provide a method for making a printed circuit board including a multi-layer printed circuit board made using a photodefinable dielectric which dielectric has enhanced copper to dielectric adhesion.

It is another object of the present invention to provide an improved printed circuit board including a multi-layer printed circuit board made using a photodefinable dielectric having enhanced metal (e.g., copper) to dielectric adhesion.

A further object of the invention is to provide a permanent dielectric polymer material having enhanced metal (e.g., copper) to dielectric substrate adhesion which is suitable for use in making printed circuit boards and which material may be applied to the boards using a variety of coating techniques such as curtain coating.

Still other objects and advantages of the invention will in part be obvious and will in part be apparent from the specification.

SUMMARY OF THE INVENTION

The above and other objects and advantages, which will be apparent to those skilled in the art, are achieved in the present invention which is directed, in a first aspect, to an improved printed circuit board having enhanced metal, particularly copper, to dielectric adhesion comprising a dielectric substrate, with or without circuit connecting through holes and/or having a circuit on one or both sides thereof, at least one permanent dielectric polymer layer covering the circuitry and having vias and circuitry thereon, the permanent dielectric polymer layer being formed by a composition comprising a permanent curable photosensitive liquid dielectric polymer and a metal adhesion effective amount of amorphous silica which composition is applied to the substrate or a previously formed dielectric layer and cured.

An additional aspect of the invention is directed to a method of forming an improved printed circuit board which board has a dielectric substrate having an electrical circuit on at least one surface thereof, with or without circuit connecting through holes, the method comprising the steps for providing at least one permanent dielectric polymer layer on at least one surface of the board and covering the circuitry and the permanent dielectric polymer having vias and circuitry thereon, the permanent dielectric polymer comprising a permanent curable photosensitive liquid dielectric polymer and a metal adhesion effective amount of amorphous silica, the polymer being applied to the substrate or a previously formed dielectric layer and cured.

A further aspect of the invention is to a permanent curable photosensitive liquid dielectric polymer composition suitable for use in making printed circuit boards comprising a permanent curable photosensitive dielectric polymer and a metal adhesion effective amount of amorphous silica. The amorphous silica preferably has a defined particle size range as discussed hereinbelow.

DESCRIPTION OF THE PREFERRED EMBODIMENTS

The printed circuit boards of the subject invention are typically built on a dielectric substrate having on at least one surface thereof an electrical conductor in the form of a circuit pattern. The conductor is usually copper and the substrate an epoxy based board and for convenience the following description will relate to copper electrical conductors on a two-sided epoxy board (e.g., FR-4) having through-holes although it will be appreciated by those skilled in the art that other electrical conductors and substrate board materials may be used. Exemplary substrate materials include polyimide, ABS and polycarbonate.

The substrate material employed and the method of producing the conductive pattern thereon is not critical. In general, the substrate is composed of glass-reinforced epoxy having a thickness generally in the range of 0.010 to 0.062 inches, a flexible circuit board, a ceramic, or other dielectric polymer circuit board, the substrate having typically electrical circuitry on both major surfaces of the substrate with circuit connecting through holes. The conductive pattern on the substrate is typically produced by conventional techniques such as the subtractive, semiadditive or fully additive deposition process. These processes are well known and are described in C. F. Coombs, Jr., *Printed Circuits Handbook*, Ed. McGraw Hill, 1979, which is incorporated herein by reference.

In accordance with the present invention, irrespective of the method employed to produce the initial copper circuit pattern, the circuitry is subsequently covered with an energy (e.g., photo) sensitive dielectric material which is patterned and cured and to which copper is applied to form a circuit pattern thereon.

The dielectric material is photodefinable and may be selected from a variety of suitable materials such as polyimides, polyamides, benzocyclobutene based resins, polyquinolines, epoxies and acrylated epoxies. The dielectric material is preferably a material which is attacked by swell and/or etchant processes using, for example, etchants like alkaline permanganate solutions, to provide a roughened dielectric surface for enhanced metal plating adhesion. An acrylated epoxy is the preferred dielectric material. Well-known acrylated epoxies include fully acrylated and half-acrylated derivatives of the diglycidyl ether of bisphenol A. A photodefinable material is defined as a material which upon exposure to an energy source such as UV, is hardened or otherwise cured making it more or less resistant to solvents than the unexposed portions of the photodefinable material. The cured dielectric preferably has a dielectric constant less than about 4.5, preferably less than about 3.6, is substantially resistant to plating solutions, provides the necessary resolution to form thin circuit lines and small vias, a high Tg above about 160° C., e.g., 167° C. among other such properties.

It has been found that the adhesion of metal plating to the finally cured dielectric material may be significantly enhanced by the use of amorphous silica in the dielectric composition. The preferred silica is a synthetic amorphous silica preferably having a defined particle size by Malvern Mastersizer up to 50 microns, or more, e.g., 1.7 to 49 microns, preferably about 8 to 12 microns, e.g., 11.5 microns. The preferred silica because of its demonstrated effectiveness is Syloid LV-6 sold by W. R. Grace & Co.

The silica is employed in the dielectric material in an effective adhesion promoting amount which may vary widely depending on the dielectric used and is generally in an amount, by weight, up to about 20% or more, about 5 to 15%, preferably 9 to 12% and most preferably 10 to 12%.

The silica may be added to the dielectric material and mixed to form a homogenous mixture. Mixing may be accomplished by a mixer and then the mixture milled. Generally, it is preferred to use a solvent in the dielectric composition to control the viscosity for application purposes in an amount of, by weight, about 35 to 60% preferably 45 to 50%. Typical solvents include 2-butoxy ethyl acetate (EBA), propylene glycol monomethyl ether (Dowanol PM), or propylene glycol monomethyl ether acetate (Dowanol PMA). EBA is preferred because of its demonstrated effectiveness. It is preferred that the viscosity of the dielectric material be about 90 to 130 seconds Aluminum Dip Cup DIN 53211, 4-mm orifice at 25° C. for ease of application using application devices such as a curtain coater.

The dielectric composition may also contain other ingredients such as photosensitizers, photoinitiators, hardeners, wetting agents and flexibilizers to provide desired characteristics.

The photodefinable dielectric is coated onto the circuit containing substrate by any suitable means such as screen coating, curtain coating, spray coating, roller coating, spin coating or as a dry film. Curtain coating and screen coating are preferred. Dielectric thicknesses in the range of about 1.5 to 2.5 mils are typically employed although greater or lesser thicknesses may be employed for certain applications. After coating, the material is exposed by conventional techniques in the desired via forming and circuit pattern. A conventional technique is UV exposure as is known in the art.

In a preferred embodiment, the regions in the coated energy sensitive material to be removed leaving an opening or via are not exposed and the exposed dielectric material is then developed using a solvent such as 0.8%–1.2% sodium carbonate solution at 38° C. for 2 minutes thereby dissolving the dielectric at the unexposed areas leaving the via and other openings in the dielectric. After developing, it is generally desirable to further cure the dielectric to yield a more stable substrate material having the dielectric properties needed for reliable printed circuit boards. In general, the first exposure and curing of the dielectric may be performed as follows. After coating and drying, the board is cooled to room temperature and then exposed through a phototool in a conventional vacuum photo exposure unit by 3 to 5 KW metal halide or mercury lamp of 350 to 450 mg/cm$^2$. After developing, the board is finally cured by using a UV Cure unit to provide a 3 Joule UV Bump followed by insertion in a convection oven at a 4.6° C./minute ramp to 163° C. for 2 hours.

After curing of the photodefinable dielectric material, any method may be employed to form the desired copper circuitry on the surface of the dielectric as discussed hereinabove. For example, the subtractive, additive, or semi-additive method may be employed and for convenience the following description will be directed to the subtractive method. It will be understood by those skilled in the art that other methods such as vapor deposition, sputtering, etc. may also be employed to form the circuitry on the dielectric surface.

In a preferred method of the invention, an alkaline permanganate solution is used to texture the cured dielectric material before metal plating or metal lamination of the dielectric. The method is generally described in U.S. Pat. No. 4,629,636, supra, and, in general, the permanganate component is present in the amount of about 1 g/l to the limit of its solubility in the medium, typically water, and the pH of the composition is alkaline and preferably above about 10, and more preferably above about 13, e.g., between 13 and 14. The permanganate solution preferably has a secondary oxidant component having an oxidation potential of greater than the oxidation potential the alkaline permanganate solution. The amount of the secondary component may vary widely and is about 0.5 gram equivalent of oxidant per gram equivalent of the manganate ion concentration to a stoichiometric amount or more.

The permanganate composition is employed at an elevated temperature and is, in general, above about 70° C., e.g., 79° C., to the lesser of the boiling point of the solution and the softening point of the plastic. For the preferred acrylated epoxy dielectric material discussed above, the temperature is preferably about 77 to 80° C.

The effective contact time will vary with the concentration and temperature of the solution and the plastic substrate being treated and in general will not exceed about 30 minutes, preferably about 5 to 15 minutes, e.g., 10 minutes. For the acrylated epoxy dielectric material discussed above, a contact time of about 5 minutes at a temperature of about 79 to 80° C. has been found to provide excellent results.

The alkaline permanganate treatment preferably starts by contacting the cured dielectric with a swellant composition to enhance the effect of the subsequent permanganate etching step as described in U.S. Pat. Nos. 3,758,732; 3,865,623 and 4,086,128, the disclosures of which are hereby incorporated by reference. The preferred swellant is a mixture of glycol ethers and NaOH, which is employed at a temperature of about 80° C. for 5 minutes.

After water rinsing, the board is then etched with the alkaline permanganate solution and then water rinsed. Neutralization with a reductant to solubilize manganese residues is then performed and the board rinsed providing a board ready for electroless metal plating using conventional procedures.

In a highly preferred aspect of the invention, the alkaline permanganate etching process is performed a plurality of times, preferably twice. It has been found that the use of two alkaline permanganate etching processes significantly enhances the adhesion of metal plating to the dielectric surface. The conditions and concentrations for the second alkaline permanganate treating process are preferably the same as for the first alkaline permanganate etching process.

After etching, it is preferred to remove hydrocarbon soils and oxides from the board using a cleaner containing materials such as an acidic cleaner conditioner containing emulsifiers and conditioning agent. The board is then micro-etched using for example, an oxypersulfate etchant. A 10% sulfuric acid treatment of about 2 minutes at room temperature is then preferably employed to dissolve any oxypersulfate residue.

The board is then treated with an activator pre-dip and then activated with a catalyst such as a tin chloride-palladium colloidal catalyst which is well known in the art as shown in U.S. Pat. No. 3,011,920. Following a water rinse, the catalyzed board is then preferably immersed in a post-activator to activate the catalyst by freeing the metal palladium ions on the board. After a water rinse, the board is immersed in an electroless copper plating solution for a period of time sufficient to plate copper to the desired thickness on the surface. Generally, a flash thickness of about 40 to 120 microinches, typically 60 to 80 microinches will be plated. The board is then baked at about 110° C. for 30 minutes. It is then preferred to electroplate the board using a copper electroplating bath to provide a copper thickness of about 1 to 1.2 mils. The board is then preferably baked at about 150 to 160° C. for 15 to 30 minutes to improve copper adhesion to the dielectric.

After plating, a photoresist is applied to the copper layer and imaged in the desired pattern and developed so that the areas of the copper that are to ultimately form the desired copper pattern remain covered. The portions of the copper layer that are not covered by the developed photoresist are removed by etching, and the photoresist is stripped leaving the desired copper pattern on to the surface of the dielectric substrate.

The above procedure may be repeated any number of times to form the desired multilayer printed circuit board with a solder mask protective layer applied to the upper dielectric surface.

The present invention will now be described by reference to the following examples.

EXAMPLE

Double sided FR-4 boards with a copper circuit layer on each side were coated using a double sided screen printer with 2 to 2.5 mils of an acrylated epoxy permanent photo-definable liquid composition dielectric using EBA as a solvent containing an additive as shown below in the Table. The dielectric was applied in two coats with a tack dry of about 71° C. for 30 minutes and 40 minutes after the respective applications. The boards were then exposed with an image in a Colight 1330 5 kW Contact Exposure Unit at 525 mj/cm and developed through a Chemcut Developer with 1% by weight aqueous sodium carbonate solution at about 38° C. for 2 minutes. The boards were then subjected to a 3 Joule UV bump and thermally cured at about 163° C. for 2 hours with 30 minutes up and down ramp times to room temperature.

The boards were then textured, catalyzed and plated by contacting the boards with the following:

1. glycol ether sodium hydroxide swellant at 80° C. for 5 minutes.
2. Water rinse for 5 minutes.
3. Alkaline permanganate solution at 80° C. for 10 minutes.
4. Water rinse for 5 minutes.
5. a hydroxylamine sulfate neutralizer at 66° C. for 5 minutes.
6. Water rinse for 5 minutes.
7. Repeat steps 1–6.
8. Acidic cleaner/conditioner at 63° C. for 5 minutes.
9. Water rinse for 5 minutes.
10. Copper microetch at room temperature for 3 minutes.
11. Water rinse for 2 minutes.
12. 10% sulfuric acid at room temperature for 2 minutes.
13. Water rinse 1 minute.
14. High chloride, low acid activator pre-dip at room temperature for 1 minute.
15. Pd/Sn Activator at 30° C. for 5 minutes.
16. Water rinse for 5 minutes.
17. Fluoride free post activator at room temperature for 3 minutes.
18. Water rinse for 2 minutes.
19. Low formaldehyde, high speed EDTA based electroless copper bath at 48° C. for 30 minutes.
20. Water rinse for 2 minutes.
21. 15 seconds in an antitarnish solution.
22. Bake at 110° C. for 30 minutes.
23. Microetch using an oxypersulfate etchant.
24. 10% sulfuric acid at 22° C. for 2 minutes.
25. Electrolytic copper bath at 25 amps per square foot (ASF) for 1 hour at 25° C.
26. Water rinse for 2 minutes. 27. Bake at 163° C. for 30 minutes.

The peel strength in lbs/inch was determined by Instron. Pc represents the number of peaks per inch (Pc) and the test was performed on the board prior to plating. The average roughness of the board (Ra) was performed on the board prior to plating using a Hommel Tester T-500 surface profilometer.

| RUN | ADHESION PROMOTER (by weight) | Pc (peaks per inch) | Ra-average roughness ($\mu$in.) | Peel Strength (lbs/in.) |
|---|---|---|---|---|
| 1 | 10% Amorphous silica | 370 ± 33 | 118 ± 5 | 5.4–6.0 |
| 2 | 10% Amorphous silica | 371 ± 15 | 95 ± 7 | 4.50 |
| 3 | 15% Amorphous silica | 325 ± 33 | 110 ± 5 | 2.80 |
| A | 10% Crystalline silica | 94 ± 15 | 37 ± 2 | 0.50 |
| B | 20% Crystalline silica | 129 ± 10 | 54 ± 2 | 0.35 |
| C | 10% Clay | 116 ± 58 | 38 ± 7 | 0.38 |
| D | 20% Clay | 118 ± 13 | 40 ± 7 | 0.20 |
| E | 10% Talc | 167 ± 41 | 40 ± 7 | 0.35 |
| F | 20% Talc | 126 ± 18 | 43 ± 6 | 0.55 |
| G | 10% Polyethylene | 138 ± 46 | 40 ± 6 | 1.20 |
| H | 20% Polyethylene | 307 ± 33 | 98 ± 16 | 1.60 |
| I | 10% Alumina | 58 ± 8 | 29 ± 8 | 0.45 |
| J | 20% Alumina | 53 ± 15 | 34 ± 9 | 0.60 |

The silica of Run 1 is Syloid LV-6 sold by W. R. Grace & Co. and has an average particle size of 7.5 microns via Coulter and 11.5 microns via Malvern. The silica of Runs 2 and 3 is GASIL HP39 sold by Crosfield Company and has an average particle size of 8.5 microns via Coulter and 10.0 microns via Malvern and a particle size range of 9.3–11.1 by Malvern.

The results in the Table clearly show that the dielectric containing amorphous silica (Runs 1, 2 and 3) exhibited significantly higher peaks per inch, average roughness and peel strength than runs A–J using other materials, including crystalline silica.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of making an improved printed circuit board which board comprises a dielectric substrate having an electrical circuit on at least one surface thereof, with or without circuit connecting through holes, and at least one permanent dielectric polymer layer thereon having vias and a circuit thereon, said method comprising the steps of:

applying a permanent dielectric polymer composition on at least one surface of the board covering the circuitry, the permanent dielectric polymer having enhanced metal to permanent dielectric polymer adhesion for metal plated on the permanent dielectric polymer the composition comprising a permanent curable photo-sensitive liquid dielectric polymer and a metal adhesion effective amount of amorphous silica present in an amount up to about 20% by weight;

curing the dielectric polymer composition;

plating a circuit on the cured permanent dielectric layer; and for printed circuit boards having more than one permanent dielectric polymer layer, applying the permanent dielectric composition on the previously cured and plated dielectric layer, curing the dielectric polymer, plating a circuit on the cured permanent dielectric layer and repeating the applying and plating steps until the desired printed circuit board is made.

2. The method of claim 1 wherein vias are formed in the permanent dielectric layer by photoforming.

3. The method of claim 2 wherein electrical circuits are formed on the surface of the permanent dielectric polymer to communicate with other circuitry of the board.

4. The method of claim 3 wherein the printed circuit board contains a plurality of permanent dielectric polymer layers containing vias and electrical circuitry thereon.

5. The method of claim 1 wherein the dielectric polymer is selected from the group consisting of epoxy, polyimide, polyamide, benzocyclobutene based resins, polyquinolines and acrylated epoxy.

6. The method of claim 5 wherein the dielectric polymer is an acrylated epoxy.

7. The method of claim 1 wherein the cured board is treated with a swellant and an alkaline permanganate solution.

8. The method of claim 7 wherein the treated cured board is treated again with a swellant and an alkaline permanganate solution.

9. An improved printed circuit board having at least one layer of a permanent dielectric polymer layer thereon having vias and a circuit thereon the permanent dielectric layer having enhanced metal circuit to dielectric polymer layer adhesion comprising:

a dielectric substrate, with or without circuit connecting through holes, having a circuit on one or both sides thereof; and a permanent dielectric polymer layer on at least one side of the dielectric substrate covering the circuitry, the permanent dielectric polymer having enhanced metal to polymer adhesion for metal plated on the permanent dielectric polymer the polymer formed by applying a composition comprising a permanent curable photo-sensitive liquid dielectric polymer and a metal adhesion effective amount of amorphous silica present in an amount up to about 20% by weight, which composition is applied as a layer on the dielectric substrate and then cured;

a circuit on the cured permanent dielectric layer; and additional permanent dielectric layers and circuits thereon to form the desired printed circuit board.

10. The printed circuit board of claim 9 having photo formed vias extending through the permanent dielectric polymer layer.

11. The printed circuit board of claim 10 wherein the permanent dielectric polymer layer has circuitry formed on the surface thereof to communicate with other circuitry of the board.

12. The printed circuit board of claim 11 containing additional permanent dielectric polymer layers containing vias and electrical circuits thereon.

13. The printed circuit board of claim 9 wherein the dielectric polymer is selected from the group consisting of epoxy, polyimide, polyamide, benzocyclobutene based resins, polyquinolines and acrylated epoxy.

14. The printed circuit board of claim 13 wherein the dielectric polymer is an acrylated epoxy.

* * * * *

UNITED STATES PATENT AND TRADEMARK OFFICE
CERTIFICATE OF CORRECTION

PATENT NO. : 5,998,237
DATED : December 7, 1999
INVENTOR(S) : Conrod et al.

It is certified that error appears in the above-identified patent and that said Letters Patent is hereby corrected as shown below:

Column 1, line 9, delete "circuits" and substitute therefor
-- circuit --.

Column 1, line 30, delete "facility" and substitute therefor
-- facilitate --.

Column 1, line 39, delete "FR4" and substitute therefor -- FR-4 --.

Column 6, line 15, between "potential" and "the" insert -- of --.

Column 8, line 16, Step 27 should start on a new line.

In the claims

Claim 9, column 10, line 8, delete "and".

Signed and Sealed this

Eighteenth Day of July, 2000

Attest:

Q. TODD DICKINSON

Attesting Officer      Director of Patents and Trademarks